(12) United States Patent
Tzuang et al.

(10) Patent No.: US 7,889,029 B2
(45) Date of Patent: Feb. 15, 2011

(54) ACTIVE BANDPASS FILTER

(75) Inventors: Ching-Kuang C. Tzuang, Taipei (TW); Hsien-Hung Wu, Taipei (TW)

(73) Assignee: National Taiwan University, Taipei (TW)

( * ) Notice: Subject to any disclaimer, the term of this patent is extended or adjusted under 35 U.S.C. 154(b) by 33 days.

(21) Appl. No.: 11/690,191

(22) Filed: Mar. 23, 2007

(65) Prior Publication Data
US 2007/0236280 A1 Oct. 11, 2007

(30) Foreign Application Priority Data
Mar. 24, 2006 (TW) ............................. 95110201 A

(51) Int. Cl.
*H01P 1/203* (2006.01)
*H03H 11/10* (2006.01)

(52) U.S. Cl. ...................... 333/205; 333/216

(58) Field of Classification Search ............... 333/175, 333/213–217, 202–205; 327/552, 557; 331/107 SL, 331/115, 116 FE, 117 FE, 117 D, 45
See application file for complete search history.

(56) References Cited

U.S. PATENT DOCUMENTS

| | | | | |
|---|---|---|---|---|
| 5,561,398 A * | 10/1996 | Rasmussen | ............... | 331/36 C |
| 6,225,871 B1 * | 5/2001 | Chien | ................... | 331/117 FE |
| 6,342,820 B1 * | 1/2002 | Leyten et al. | ........... | 331/117 D |
| 6,621,370 B1 * | 9/2003 | Dao | ............................. | 333/25 |
| 6,650,195 B1 * | 11/2003 | Brunn et al. | ............ | 331/177 V |
| 6,944,435 B2 * | 9/2005 | Contopanagos et al. | ..... | 455/307 |
| 7,289,002 B2 * | 10/2007 | Jeon et al. | .............. | 331/117 FE |
| 2005/0095998 A1 * | 5/2005 | Toncich | ...................... | 455/129 |
| 2005/0116784 A1 * | 6/2005 | Ravi et al. | ..................... | 331/45 |

OTHER PUBLICATIONS

Tzuang et al., "CMOS Active Bandpass Filter Using compacted Synthetic Quasi-TEM lines at C-Band", IEEE Trans. on Microwave and Techniques, vol. 54, No. 12, Dec. 2006, pp. 4548-4555.*
Tzuang et al., "LC-Free CMOS Oscillator Employing Two-Dimensional Transmission Line", Proceeding of the 2003 IEEE International Frequency Conntrol Symposium, pp. 487-489, 2003.*

(Continued)

*Primary Examiner*—Benny Lee
*Assistant Examiner*—Gerald Stevens
(74) *Attorney, Agent, or Firm*—WPAT., P.C.; Justin King

(57) ABSTRACT

An active bandpass filter is disclosed herein. The active bandpass filter has N transmission lines, N negative resistant circuits, a DC circuit, and at least (N−1) coupling circuit. Each transmission line has a first end and a second end. Each negative resistant circuit has a third end and a fourth end and is electrically coupled with a related transmission line, wherein the third end and the fourth end are electrically coupled with the first end and second end, respectively. The DC circuit provides a bias voltage for N negative resistant circuits, wherein the DC circuit electrically couples with N transmission lines via N coupling elements. Each coupling circuit has a fifth end and a sixth end and is electrically coupled with any two transmission lines, wherein the fifth end and sixth end are electrically coupled with the second end and the first end, respectively.

21 Claims, 10 Drawing Sheets

OTHER PUBLICATIONS

Hsien-Shun Wu, Houng-Jay Yang, Ching-Juang Peng, Ching-Kuang C. Tzuang; Miniaturized Microwave Passive Filter Incorporating Multilayer Synthesis Quasi-TEM Transmission Line; IEEE Transactions on Microwave Theory and Techniques, pp. 2713-2720; vol. 53, No. 9, Sep. 2005.

Mini-Circuits Inc. "Characterization Phase Noise", Jan. 2003, 2 pages, Brooklyn, New York, USA.

Agilent Technologies Inc. "Microwave Oscillator Design", 1999, 4 pages, Santa Clara, California, USA.

Murata Inc. "Filters for Communciation Equipment", Jan. 5, 2010, 1 page, Kyoto, Japan.

David M. Pozar "Microwave Engineering" 3rd ed. Hoboken, 2005, pp. 275, 292-295, Wiley & Sons, New Jersey, USA.

* cited by examiner

ACTIVE BANDPASS FILTER

BACKGROUND OF THE INVENTION

1. Field of the Invention

The present invention generally relates to bandpass filters, and more particularly to active bandpass filters.

2. Description of the Prior Art

In microwave applications it has proven economical to incorporate as many components (e.g. antenna, balun, filters etc.) as possible into a System-on-Chip (SoC) integrated circuit thereby to reduce dependence upon off-chip components. However, passive filters utilizing semiconductor passive components commonly suffers large insertion loss and large chip area. Accordingly, extremely careful engineering processes must be exercised in manufacturing if low chip yield is to be avoided. Such engineering efforts are expensive and are particularly undesirable where the critical circuit involves only a small portion of the SoC integrated circuit.

Alternately, negative impedance based on active components has widely been used to improve characteristics of microwave passive filters. One such method is realized by employing a active transistor in conjunction with a capacitive feedback coupled to a passive microstrip bandpass filter in hybrid technology (Chi-Yang Chang and Tatsuo Itoh, "Microwave Active Filters Based on Coupled Negative Resistance Method," *IEEE Trans. Microw. Theory Tech.* vol. 38, no. 12, pp. 1879-1884, December 1990.). The same negative resistance circuit had also been applied to an active coplanar waveguide bandpass filter in GaAs technology (Masaharu Ito, Kenichi Maruhashi, Shuya Kishimoto, and Keiichi Ohata, "60-GHz-Band Coplanar MMIC Active Filters," *IEEE Trans. Microw. Theory Tech.* vol. 52, no. 3, pp. 743-750, March 2004.). Specifically, the effective bandwidth of this negative resistance circuit is limited and has to be designed in accordance with the passband frequency. Another disadvantage is the volume sizes of these filters could not be effectively shirked due to the passive transmission line circuit.

Another type of negative resistance circuit utilizes a cross-coupled pair of active transistors operating in differential mode to accommodate broadband negative impedance. This method commonly requires the architecture of an active filter to be fully balanced and almost doubles the number of passive components compared to the conventional single-ended passive filter (Dandan Li and Yannis Tsividis, "Design techniques for Automatically tuned integrated gigahertz-range active LC filters," *IEEE J. Solid-State Circuits*, vol. 37, no. 8, pp. 967-977, August 2002.). Furthermore, for volume-size considerations, monolithic active filters designed to operate at gigahertz range in silicon technology usually employs lump inductive components accompanying the skin loss, substrate loss, and mutual coupling (Shaorui Li, Nebojsa Stanic, Krishnamurthy Soumyanath, and Yannis Tsividis, "An Integrated 1.5 V 6 GHz Q-Enhanced LC CMOS Filter with Automatic Quality Factor Tuning Using Conductance Reference," *2005 IEEE Int. Radio Frequency Integrated Circuits Symp. Dig.*, pp. 621-624, July 2005.) Thus, a further disadvantage is that an additional tuning system has to be implemented with this active filter to accommodate a constant center frequency and passband flatness among different chips. It is desirable, therefore, to provide a low manufacturing cost, low volume in size, and low complexity active bandpass filter for microwave applications (Ching-Kuang C. Tzuang, Hsien-ung Wu, Hsien-Shun Wu, and Johnsea Chen, "CMOS active bandpass filter using compacted synthetic Quasi-TEM lines at C Band," *IEEE Trans. Microw. Theory Tech.* vol. 54, no. 12, pp. 4555-4548, December 2006.).

SUMMARY OF THE INVENTION

The present invention provides an active bandpass filter, comprising: N transmission line circuits, each of the N transmission line circuits having a first end and a second end, wherein $N \geq 2$ and N is a natural number; N negative impedance circuits, each of the N negative impedance circuits having a third end and a fourth end, each of the N negative impedance circuits correspondingly coupling with each of the N transmission line circuits, wherein the third end correspondingly coupling with the first end and the fourth end correspondingly coupling with the second end, thereby forming N resonators with negative impedances; a Direct Current (DC) circuit for providing a DC power offset for the N negative impedance circuits, wherein the DC circuit correspondingly couple with the N resonators with negative impedances via N coupling elements; and at least (N−1) first coupling circuits, each of the at least (N−1) first coupling circuits having a fifth end and a sixth end, each of the at least (N−1) first coupling circuits coupling with corresponding two of the N resonators with negative impedances, wherein the fifth end of a first of the at least (N−1) first coupling circuits couples with the second end and the fourth end of a first of the N negative impedance circuits, and the sixth end of the first of the at least (N−1) first coupling circuits couples with the first end and the third end of a second of the N negative impedance circuits, wherein each successive of the at least (N−1) first coupling circuit is singly coupled between each successive neighboring pair of the N negative impedance circuits in an identical fashion.

The present invention also provides a resonator circuit. This resonator circuit is used for reducing energy transmission loss in an active bandpass filter. The resonator circuit includes: a transmission line circuit having a first end and a second end; and a negative impedance circuit having a third end and a fourth end, the negative impedance circuit coupling with the transmission line circuit, wherein the third end couples with the first end and the fourth end couples with the second end, thereby forming the resonator circuit with negative impedance.

BRIEF DESCRIPTION OF THE DRAWINGS

The accompanying drawings incorporated in and forming a part of the specification illustrate several aspects of the present invention, and together with the description serve to explain the principles of the disclosure. In the drawings.

DETAILED DESCRIPTION OF THE PREFERRED EMBODIMENTS

Some embodiments of the present invention will now be described in greater detail. Nevertheless, it should be noted that the present invention can be practiced in a wide range of other embodiments besides those explicitly described, and the scope of the present invention is expressly not limited except as specified in the accompanying claims.

Moreover, some irrelevant details are not drawn in order to make the illustrations concise and to provide a clear description for easily understanding the present invention.

Figure 1:
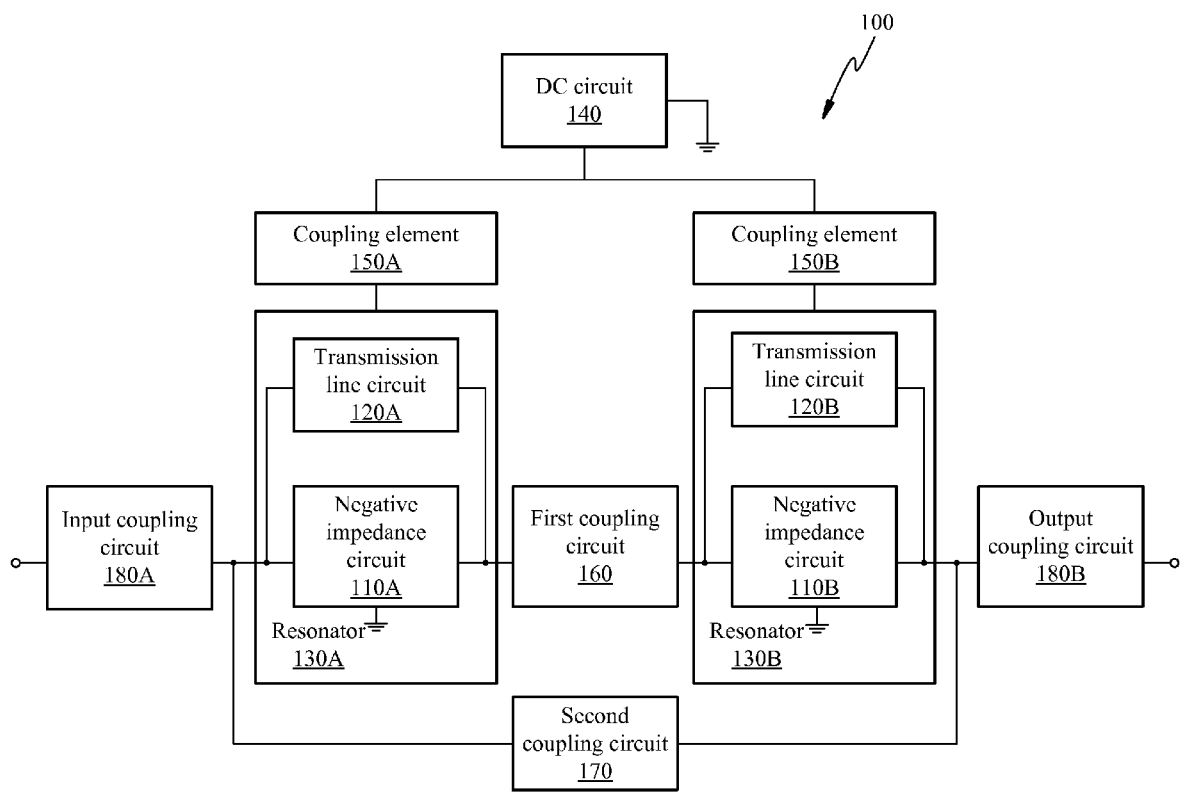
FIG. 1 is a schematic circuit block diagram depicting a preferred embodiment of the present invention.

Referring to FIG. 1, a schematic block diagram of a preferred embodiment 100 of the present invention is shown. The present embodiment 100 comprises two resonators 130A and 130B, a Direct Current (DC) circuit, two coupling elements 150A and 150B and a first coupling circuit 160. The resonators 130A and 130B further includes negative impedance circuits 110A and 110B and transmission line circuits 120A and 120B, respectively. In this embodiment, equivalent electrical lengths of the transmission line circuits 120A and 120B are respectively (M/2) times ±15% (M is a natural number) of the bandpass frequency wavelength of the active bandpass filter of the present invention, and respectively have a first end and a second end. The transmission line circuits 120A and 120B can be complementary conducting strip transmission lines, microstrip lines, strip lines, coplanar waveguide transmission lines or coupled transmission lines etc. Of course, they can also be a combination of the above transmission lines. The circuit layout may be a two-dimensional or three-dimensional layout structure (Hsien-Shun Wu, Houng-Jay Yang, Ching-Juang Peng, and Ching-Kuang C. Tzuang, "Miniaturized Microwave Passive Filter Incorporating Multilayer Synthetic Quasi-TEM Transmission Line", IEEE Trans. on Microwave Theory and Tech. vol. 53, pp. 2713-2720, September 2005). In this embodiment, the negative impedance circuits 110A and 110B respectively have a third end and a fourth end, correspondingly coupled to the transmission line circuits 120A and 120B, wherein the third and fourth end of the negative impedance circuit 110A respectively couples to the first and second end of the transmission line circuit 120A; the third and fourth end of the negative impedance circuit 110B respectively couple to the first and second end of the transmission line circuit 120B, forming two resonators with negative impedance. In this embodiment, the negative impedance circuits 110A and 110B generally refer to equivalent small signal impedances under the differential mode. The negative impedance circuits 110A and 110B are used to offset partial or all transmission loss of the transmission line circuit 120A and 120B.

The DC circuit 140 provides a DC power offset for the negative impedance circuits 110A and 110B, wherein the DC circuit 140 couples to corresponding resonators 130A and 130B via the coupling elements 150A and 150A. In this embodiment, the coupling elements 150A and 150B can be conductive lines (i.e. direct connection) or inductors (i.e. increasing insulation of AC signal and DC offset). The first coupling circuit 160 includes a fifth end and a sixth end for coupling with the resonators 130A and 130B, wherein the fifth end and the sixth end of the first coupling circuit 160 respectively couples to the second end and first end of the transmission line circuits 120A and 120B, that is, the fifth end and the sixth end of the first coupling circuit 160 respectively couples to the fourth end of the negative impedance circuit 110A and the third end of the negative impedance circuit 110B. In this embodiment, the first coupling circuit 160 may be equivalent circuits of capacitors, inductors or coupled transmission line structures. Additionally, this embodiment further includes a second coupling circuit 170, an input coupling circuit 180A and an output coupling circuit 180B, all having the same structure as the first coupling circuit 160, and can be equivalent circuits of capacitors, inductors or coupled transmission line structures. The second coupling circuit 170 couples to a signal input end and signal output end of the bandpass filter of the present invention, that is, the fifth end and the sixth end of the second coupling circuit 170 respectively couples to the input end of the resonator 130A and the output end of the resonator 130B. Whereas, the input coupling circuit 180A is used to couple to an external signal and the bandpass filter of the present invention, i.e. the fifth end of the input coupling circuit 180A couples to the external signal while the sixth end thereof couples to the signal input end of the resonator 130A (a first-stage resonating circuit of this embodiment). The output coupling circuit 180B is used to couple the bandpass filter and a next-stage circuit, i.e., the fifth end of the output coupling circuit 180B couples to the signal output end of the resonator 130B (a last-stage resonating circuit) and the sixth end thereof couples to the next-stage circuit.

It should be noted that the number of the resonators with negative impedances 130A and 130B is not limited to that of the present invention, that is, the present invention may include N resonators with negative impedance (N transmission line circuits and N negative impedance circuits, wherein N≧2 and is a natural number). Accordingly, the number of the coupling elements 150A, 150B and the first coupling circuit 160 can be expanded to N coupling elements and at least (N−1) first coupling circuits. Take N=4 as an example, four coupling elements may be coupled to the DC circuit and the corresponding four resonators, while not only three first coupling circuits may be coupled between the four resonators, but respective first coupling circuit may be coupled to the signal output end and the signal input end and/or between the first and third resonators, the first and fourth resonators and/or the second and fourth resonators. Therefore, when N=4, the number of first coupling circuit is at least three.

Figure 2A:
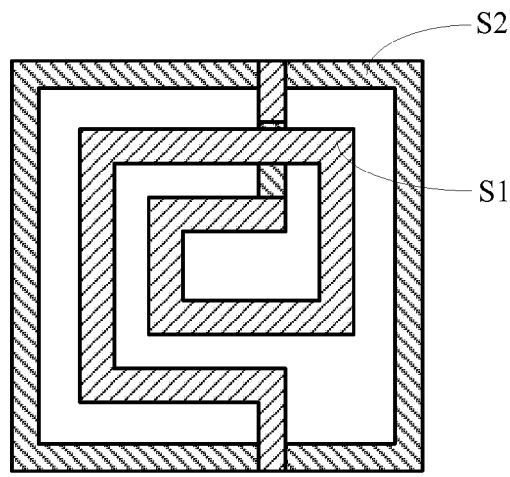
FIG. 2A is a top view of a preferred complementary conducting strip transmission line of the present invention.
Figure 2B:
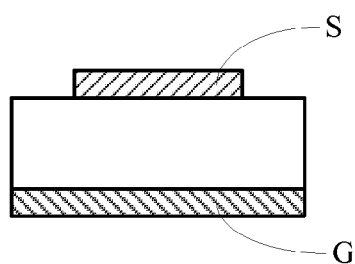
FIG. 2B is a cross-sectional diagram depicting a preferred microstrip line structure of the present invention.
Figure 2C:
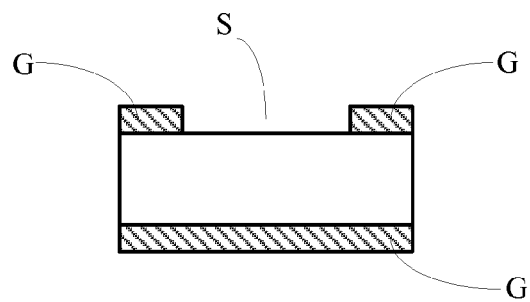
FIG. 2C is a cross-sectional diagram depicting a preferred strip line structure of the present invention.
Figure 2D:
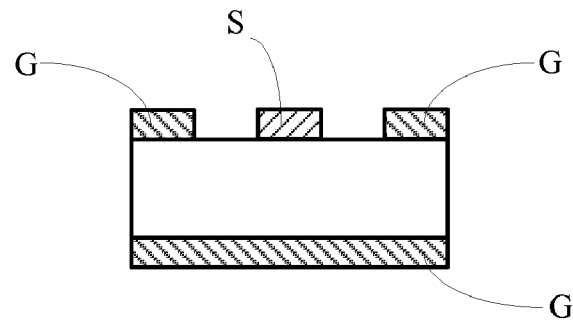
FIG. 2D is a cross-sectional diagram depicting a preferred coplanar waveguide structure of the transmission line of the present invention.
Figure 2E:
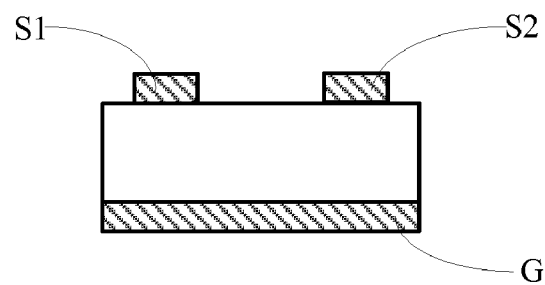
FIG. 2E is a cross-sectional diagram depicting a preferred coupled transmission line structure of the present invention.
Figure 2F:
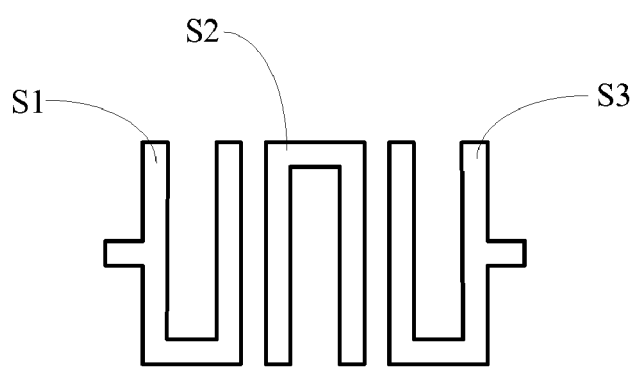
FIG. 2F is a top view depicting a preferred implementation of a combination of transmission lines and coupled transmission lines of the present invention.

Referring now to FIG. 2A, a top view of a preferred complementary conducting strip of the transmission line of the present invention is shown, wherein $S_1$ is a first transmission line (indicated by oblique lines slant from upper right to bottom left) and $S_2$ is a second transmission line (indicated by oblique lines slant from upper left to bottom right). Referring to FIG. 2B, a cross-sectional diagram depicting a preferred microstrip line of the transmission line of the present invention is shown, wherein S is a transmission line and G is a ground line. Referring to FIG. 2C, a cross-sectional diagram depicting a preferred strip line of the transmission line of the present invention is shown, wherein G are ground lines and S is the gap between the ground lines. Referring to FIG. 2D, a cross-sectional diagram depicting a preferred coplanar waveguide structure of the transmission line of the present invention is shown, wherein G are the ground lines and S is a transmission line between the ground lines G. Referring to FIG. 2E, a cross-sectional diagram depicting a preferred coupled transmission line structure of the present invention is shown, wherein $S_1$ and $S_2$ are transmission lines and G is a ground line, $S_1$ and $S_2$ are not physically connected to each other but rather transmitting signals by signal coupling. Referring to FIG. 2F, a top view depicting a preferred implementation of a combination of transmission lines and coupled transmission lines of the present invention is shown, wherein $S_1$, $S_2$ and $S_3$ are transmission lines not physically connected to each other but rather transmitting signals by signal coupling. The transmission line circuits illustrated above are only used to facilitate description of their structures; they are not to limit the transmission line circuits of the present invention. For those skilled in the art, various changes can be made to the transmission line circuits of the present invention based on the above structures without departing from the scope of the present invention.

Figure 3A:
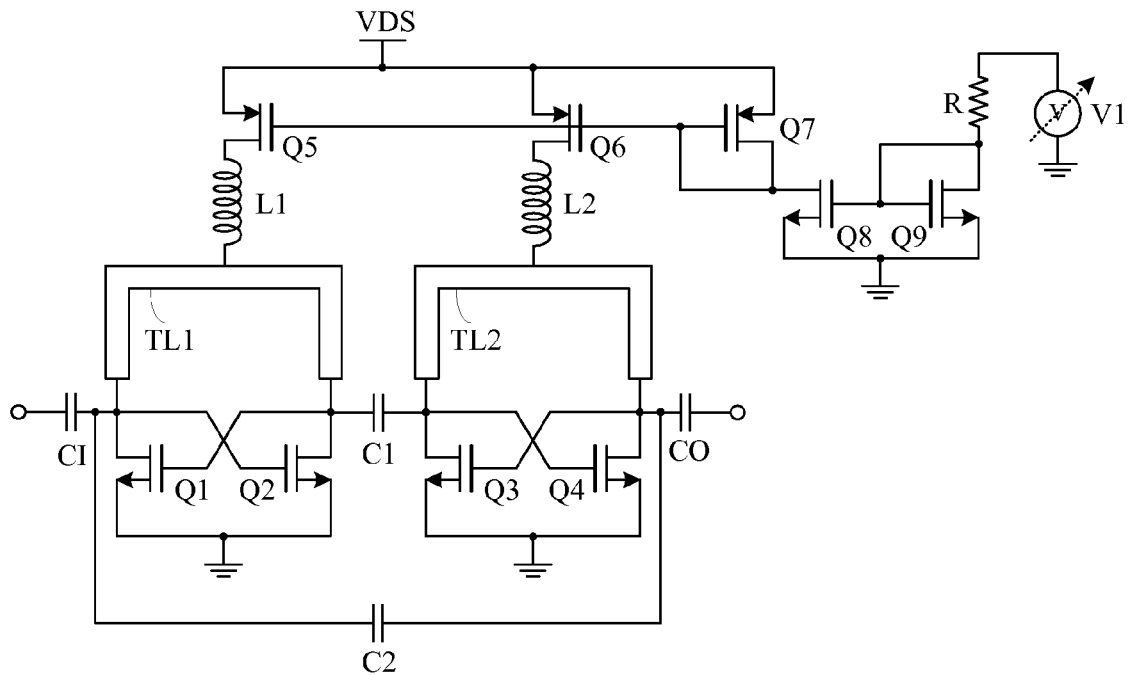
FIG. 3A is a preferred circuit embodiment of FIG. 1.

Referring to FIG. 3A, a preferred embodiment of FIG. 1 is shown. In this embodiment, equivalent electrical lengths of transmission lines TL1 and TL2 are respectively (M/2) times ±15% of the bandpass frequency wavelength of the active bandpass filter of the present invention, wherein M is a natural number. The transmission lines TL1 and TL2 may comprise a respective first end and a respective second end. The transmission lines TL1 and TL2 can be complementary conducting strip transmission lines, microstrip lines, strip lines, coplanar waveguide transmission lines or coupled transmission lines etc. Of course, they can also be a combination of the above transmission lines. The circuit layout may be a two-dimensional or three-dimensional layout structure. In this embodiment, the negative impedance circuits adopt the cross-coupled pair circuits constituted of transistors $Q_1$ and $Q_2$ and transistors $Q_3$ and $Q_4$, wherein two outputs (i.e. third end and fourth end) of the cross-coupled pair circuits respectively couple to the first and second ends of the transmission line $TL_1$ and the first and second ends of the transmission line $TL_2$, thereby forming two resonators with negative impedances. In this embodiment, the negative impedance circuits (cross-coupled pair circuits constituted of transistors $Q_1$ and $Q_2$ and transistors $Q_3$ and $Q_4$) generally refer to equivalent small signal impedances under the differential mode for offsetting partial or all transmission loss of the transmission lines TL1 and TL2. For those skilled in the art, current sources, amplifier circuits or noise filtering circuits connected in addition to the cross-coupled pair circuits are still within the scope of the present invention.

In this embodiment, the DC circuit includes a current source and a current repeater. The current source constituted of transistors $Q_8$ and $Q_9$ has a first input end (drain of $Q_9$ cascading a resistor R) and a first output end (drain of $Q_8$), wherein the first input end connects with an adjustable DC power. The current repeater constituted of transistors $Q_5$, $Q_6$ and $Q_7$ has a second input end (drain of $Q_7$) and two second output ends (drains of $Q_5$ and $Q_6$), wherein the second input end connects with the first output end of the current source and the two second output ends respectively connect with coupling elements (i.e. inductors $L_1$ and $L_2$), thereby corresponding to coupled transmission lines $TL_1$ and $TL_2$ and providing DC power offset for negative impedance circuits consisting of transistors $Q_1$ and $Q_2$ and transistors $Q_3$ and $Q_4$. It should be noted that when the above resonators are operating under the differential mode, the coupling elements may be conductive lines; when the above resonators are operating under a combination of the differential and common mode, the coupling elements are inductors that block AC signals. In this embodiment, the coupling circuit is consisted of a capacitor $C_1$ that couples the resonator consisting of the transmission line $TL_1$ and transistors $Q_1$ and $Q_2$ and the resonator consisting of the transmission line $TL_2$ and transistors $Q_3$ and $Q_4$. The two ends of the capacitor $C_1$ (fifth end and sixth end) respectively couple the second end of the transmission line $TL_1$ and the first end of the transmission line $TL_2$, that is, the two ends of the capacitor $C_1$ respectively couple the fourth end of the negative impedance circuit and the third end of the negative impedance. In this embodiment, the coupling circuit may be equivalent circuits of capacitors, inductors or coupled transmission line structures. For example, when the coupling circuit adopts a coupled transmission line structure circuit, the transmission lines $TL_1$ and $TL_2$ are only required to be arranged in parallel to achieve signal coupling, i.e. no physical circuit connection is required. In addition, this embodiment may further include a capacitor $C_2$ that has the same structure as $C_1$. The capacitor C2 couples to the signal input and the signal output end of the active filter of the present invention, i.e. the two ends of the capacitor C2 (fifth end and sixth end) respectively couple the input end of the resonator (consisting of the transmission line $TL_1$ and transistors $Q_1$ and $Q_2$) and the output end of the resonator (consisting of the transmission line $TL_2$ and transistors $Q_3$ and $Q_4$). Additionally, capacitors $C_i$ and $C_o$ are used as the signal input and output coupling, respectively, and they have the same structures as $C_1$. It should be noted that capacitors $C_1, C_2, C_i$ and $C_o$ are only used to correspondingly describe preferred implementations of the first, second, input, output coupling circuits 160, 170, 180A and 180B of FIG. 1, they should not be construed in a restrictive sense, but may also include equivalent circuits of capacitors, inductors or coupled transmission line structures.

Figure 3B:
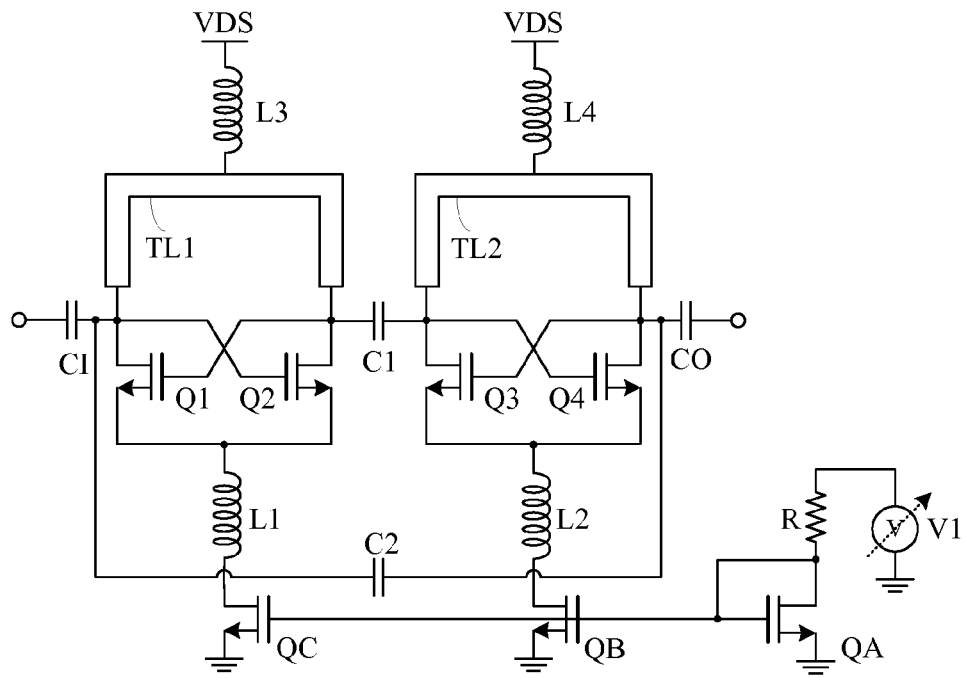
FIG. 3B is another preferred circuit embodiment of FIG. 1.

Referring to FIG. 3B, another preferred embodiment of FIG. 1 is shown. In FIG. 3B, the current repeater consisting of the p-type transistors ($Q_5, Q_6$ and $Q_7$) in FIG. 3A are replaced with a current repeater consisting of n-type transistors ($Q_C$, $Q_B$, $Q_A$); the adjustable DC power connects to the drain and the gate of the transistor $Q_A$ via the resistor R; the coupling locations of coupling elements (inductors $L_1$ and $L_2$) with the resonators with negative impedances are modified (from coupled transmission lines to coupling negative impedance circuits); and inductors $L_3$ and $L_4$ are added to block the AC signals of the transmission lines $TL_1$ and $TL_2$. Besides the above, properties and connecting structures of other elements are the same as the corresponding elements in FIG. 3A, so they will not be repeated.

Figure 4:
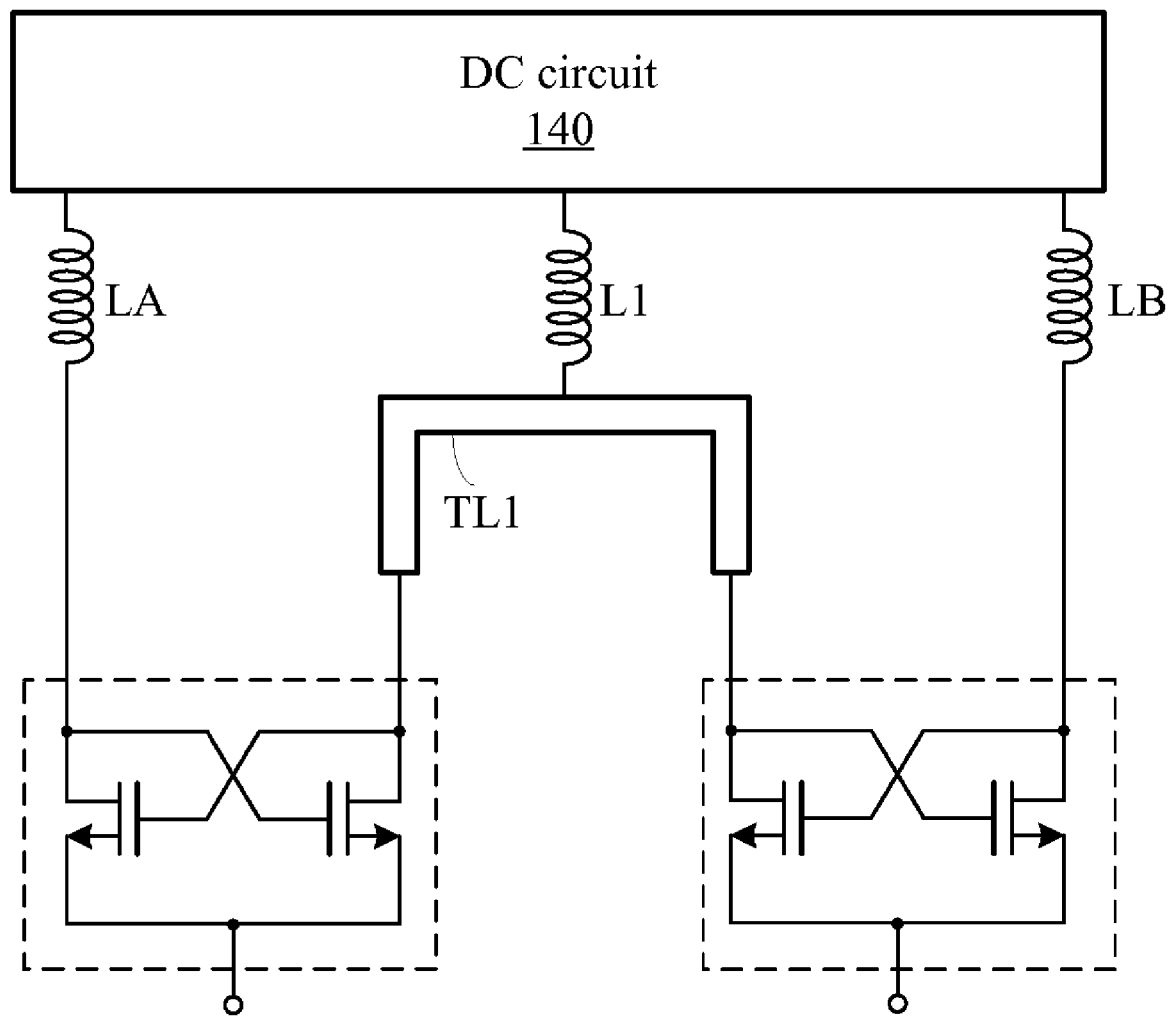
FIG. 4 is another preferred structural embodiment of negative impedance circuits of the present invention.

Referring to FIG. 4, another structural embodiment of the negative impedance circuits of the present invention is shown; herein only a resonator circuit is shown for illustration. A first end and second end of a transmission line $TL_1$ respectively couple a negative impedance circuit (a cross-coupling pair circuit in this embodiment). First output ends of the two cross-coupling pairs respectively couple to the first end and the second end of the transmission line $TL_1$. Second output ends of the two cross-coupling pairs respectively couple to a DC circuit 140 via inductors $L_A$ and $L_B$ (coupling elements), respectively. Thereby, independent negative impedance circuits can be respectively formed at the first and second ends of the transmission line $TL_1$. DC offset is provided by the DC circuit 140 via the coupling elements (inductors $L_1, L_A, L_B$). It should be emphasized that the negative impedance circuits generally refer to equivalent small signal impedances under the differential mode for offsetting partial or all transmission loss of the transmission line. For those skilled in the art, any kind of current sources, amplifier circuits or noise filtering circuits connected in addition to the cross-coupled pair circuits are considered still within the scope of the present invention.

Figure 5A:
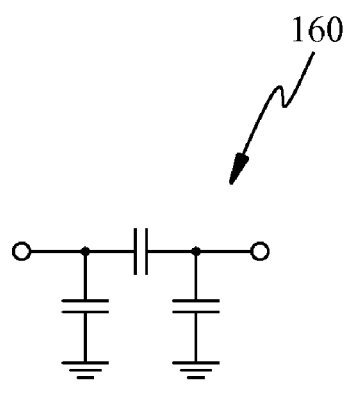
FIGS. 5A to 5D are four equivalent circuits of the preferred coupled transmission line of the present invention.
Figure 5B:
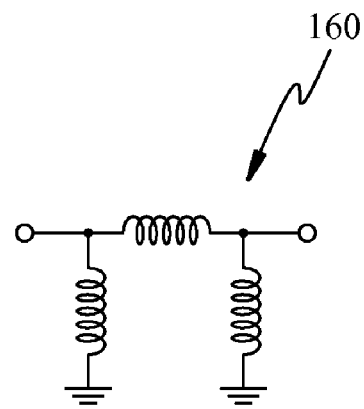
Figure 5C:
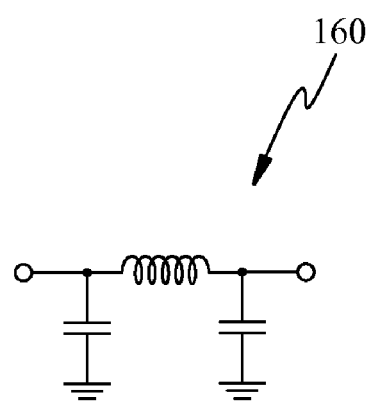
Figure 5D:
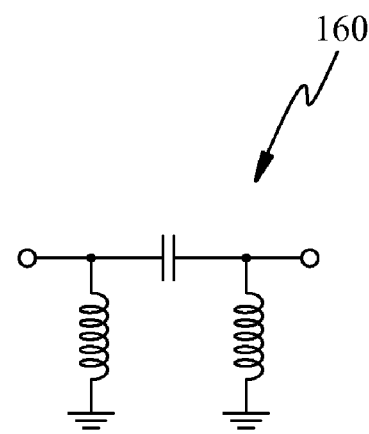

Referring to FIGS. 5A to 5D, equivalent circuits of embodiments of the coupled transmission line of the present invention are shown. An equivalent circuit 160 of the coupled transmission line is a Π-shaped structure consisting of three capacitive elements (FIG. 5A). An equivalent circuit 160 of the coupled transmission line is a Π-shaped structure consisting of three inductive elements (FIG. 5B). An equivalent circuit 160 of the coupled transmission line is a Π-shaped structure consisting of one inductive element and two capacitive elements (FIG. 5C). An equivalent circuit 160 of the coupled transmission line is a Π-shaped structure consisting of one capacitive element and two inductive elements (FIG. 5D).

Figure 6A:
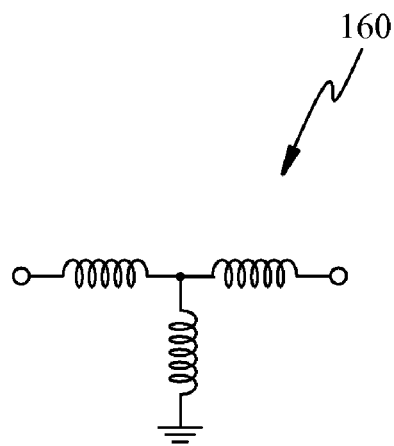
FIGS. 6A to 6D are another four equivalent circuits of the preferred coupled transmission line of the present invention.
Figure 6B:
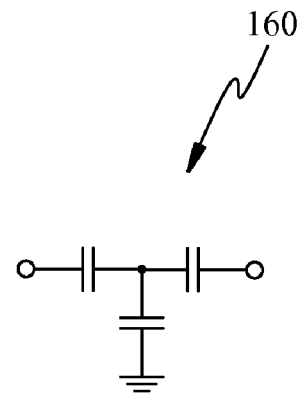
Figure 6C:
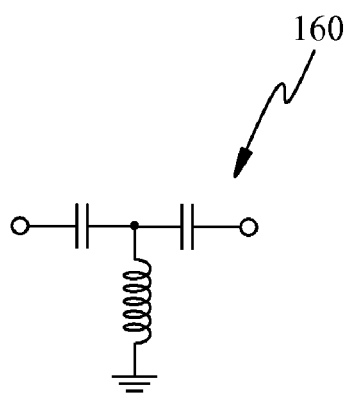
Figure 6D:
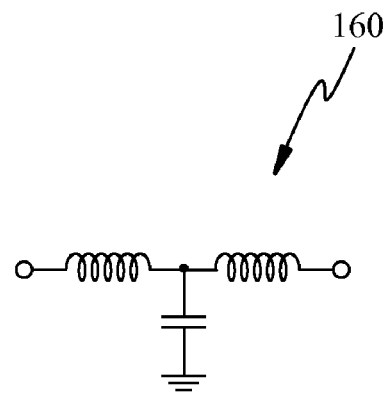

Referring to FIGS. 6A to 6D, equivalent circuits of embodiments of the coupled transmission line of the present invention are shown. An equivalent circuit 160 of the coupled transmission line is a T-shaped structure consisting of inductors inductive elements (FIG. 6A). An equivalent circuit 160 of the coupled transmission line is a T-shaped structure consisting of three capacitive elements (FIG. 6B). An equivalent circuit 160 of the coupled transmission line is a T-shaped structure consisting of one inductive element and two capacitive elements (FIG. 6C). An equivalent circuit 160 of the coupled transmission line is a T-shaped structure consisting of one capacitive element and two inductive elements (FIG. 6D). However, as mentioned before, the equivalent circuits of the coupled transmission lines in FIGS. 5A to 5D and FIGS. 6A to 6D can also be used to described the equivalent circuit embodiments of the second, input, output coupling circuits 170, 180A, 180B (FIG. 1) besides the equivalent circuit embodiments of the first coupling circuit 160 (FIG. 1).

Figure 7A:
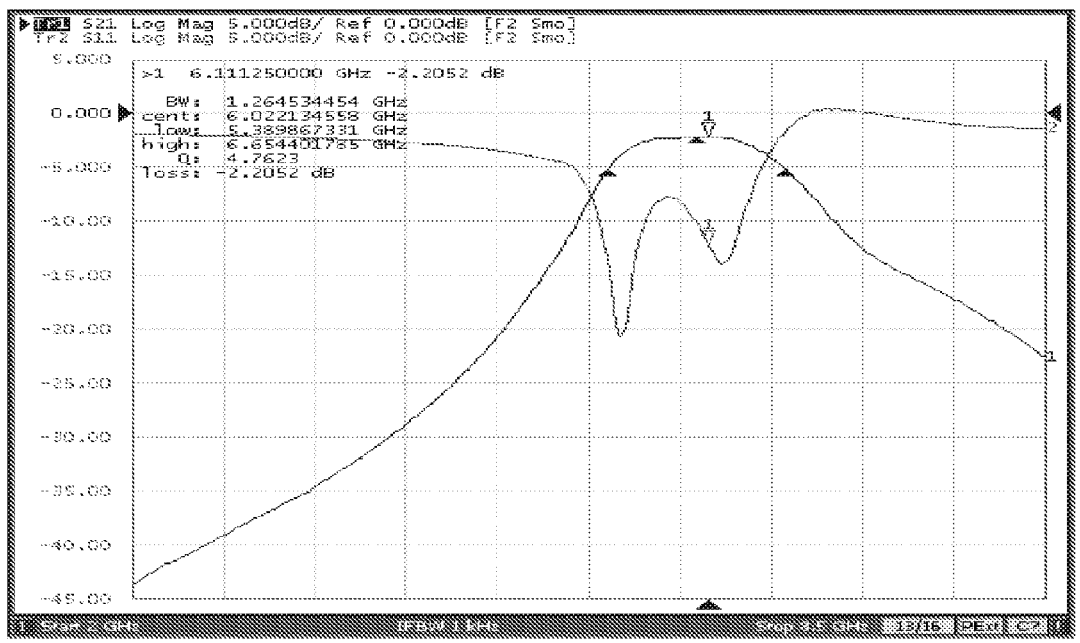
FIGS. 7A to 7C are waveforms of filtering waves and testing data related to insertion loss for the bandpass filter at control voltages 1.0V, 1.15V and 1.25V.
Figure 7B:
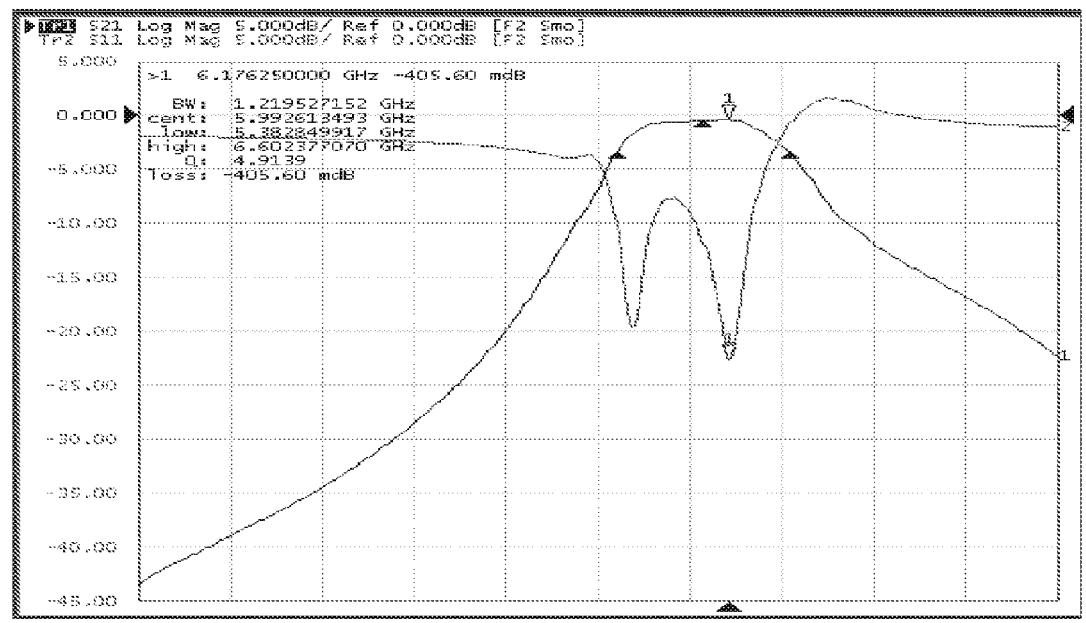
Figure 7C:
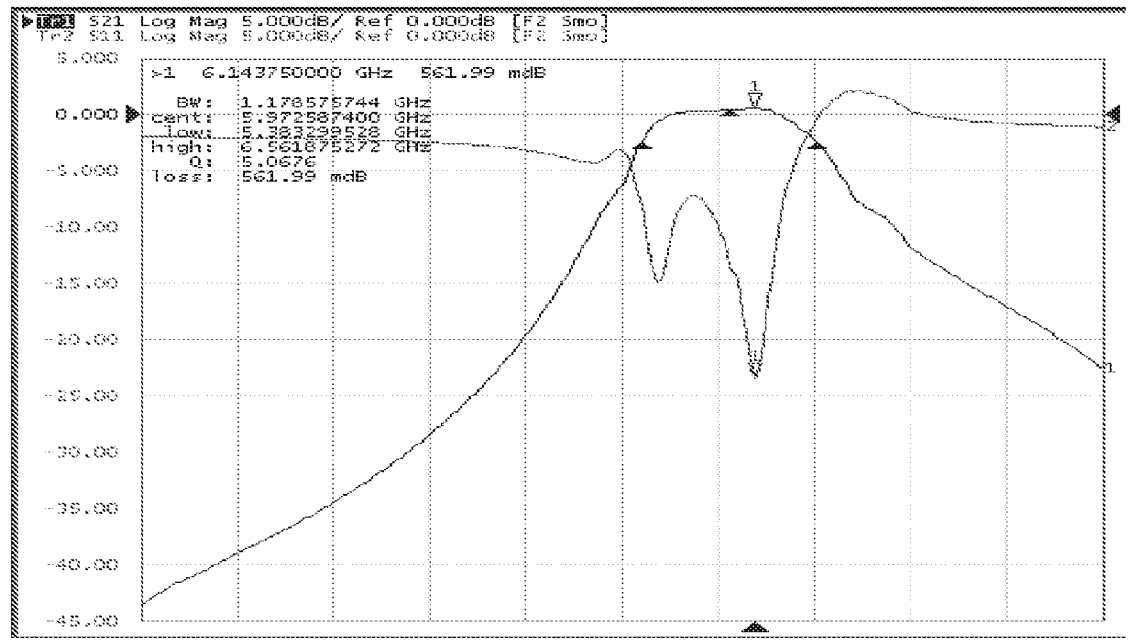
Figure 8:
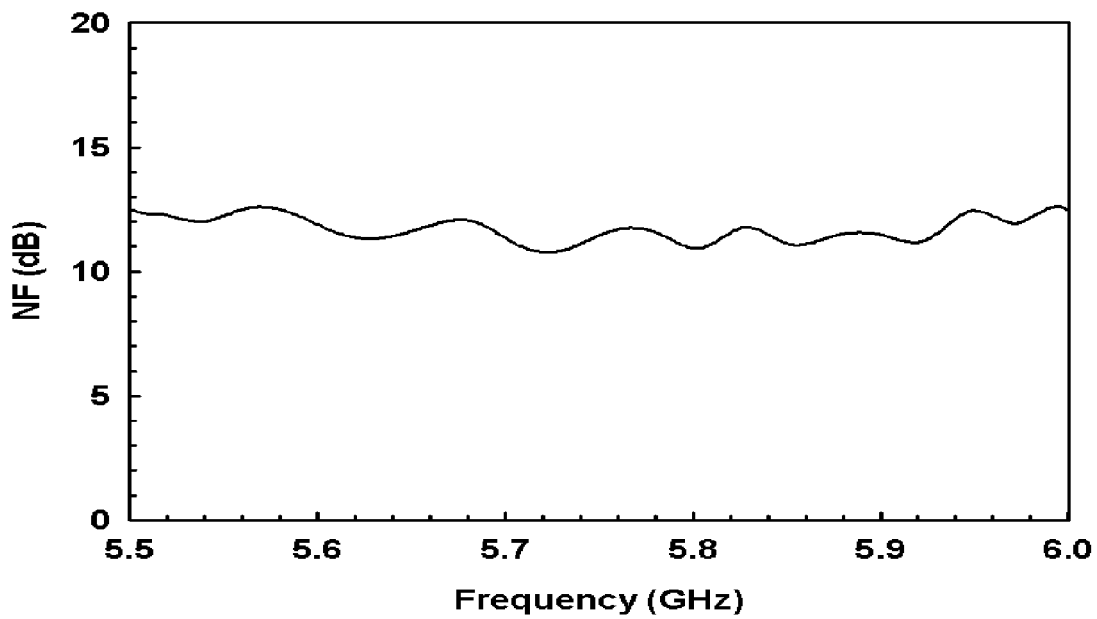
FIG. 8 is a noise index waveform of the bandpass filter of the present invention.
Figure 9A:
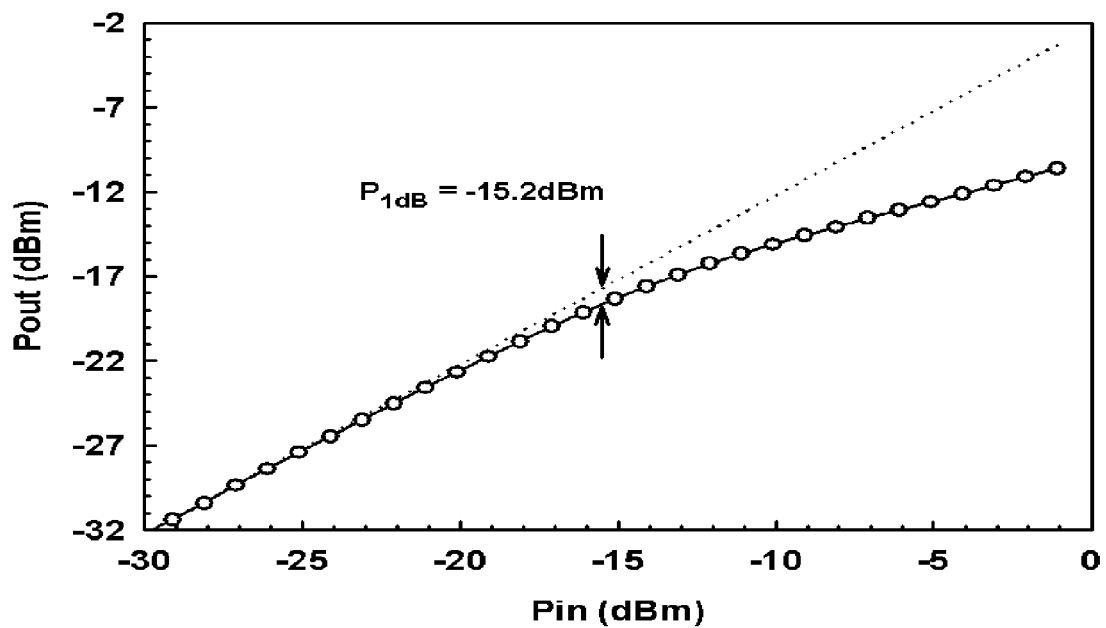
FIGS. 9A and 9B are power output curves of the bandpass filter of the present invention.
Figure 9B:
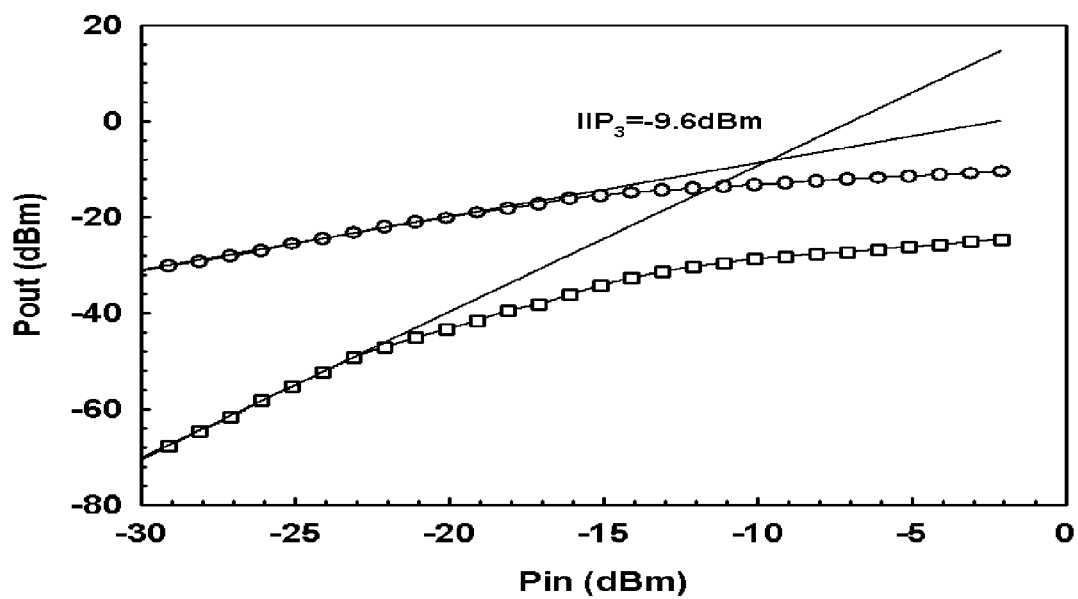

Referring to FIGS. 7A to 7C, waveforms of filtering waves and testing data related to insertion loss for the bandpass filter at control voltages 1.0V, 1.15V and 1.25V are shown, respectively. In FIG. 7A, the insertion loss is approximately 2.20 dB; in FIG. 7B, the insertion loss is approximately 0.405 dB; in FIG. 7C, the insertion loss is approximately 0.561 dB. Referring to FIG. 8, a noise index waveform of the bandpass filter of the present invention is shown, which is about 11-13 dB. Referring to FIGS. 9A and 9B, power output curves of the bandpass filter of the present invention are respectively shown. In FIG. 9A, $P_{1dB}$ is approximately −15.2 dBm. Whereas in FIG. 9B, $IIP_3$ is approximately −9.6 dBm. It is emphasized by the inventor that the above waveforms and data are only used to illustrate the measuring results of a preferred embodiment of the present invention; they should not be construed as to limit the application and effects of the present invention.

In summary of the above, the present invention adopts the cross-coupled pair circuits as negative impedances for the transmission line circuits. Therefore, when the resonators are operating under the differential mode, the transmission energy can be compensated. When the resonators are operating in a combination of the differential and common modes, the transmission energy for the differential mode is compensated, whereas the transmission energy for the common mode is attenuated.

Although specific embodiments have been illustrated and described, it will be obvious to those skilled in the art that various modifications may be made without departing from what is intended to be limited solely by the appended claims.

What is claimed is:

1. An active bandpass filter, comprising:
   N transmission line circuits, each of the N transmission line circuits having a first end and a second end, wherein N≧2 and N is a natural number;
   N negative impedance circuits, each of the N negative impedance circuits having a third end and a fourth end, each of the N negative impedance circuits correspondingly coupling with each of the N transmission line circuits, wherein the third end correspondingly couples with the first end and the fourth end correspondingly couples with the second end, thereby forming N resonators with negative impedances;
   a Direct Current (DC) circuit for providing a DC bias for the N negative impedance circuits, wherein the DC circuit correspondingly couples with the N resonators with negative impedances via N coupling elements; and
   at least (N−1) first coupling circuits, each of the at least (N−1) first coupling circuits having a fifth end and a sixth end, each of the at least (N−1) first coupling circuits coupling with a corresponding two of the N resonators with negative impedances, wherein the fifth end of a first of the (N−1) first coupling circuits couples with the second end and the fourth end of a first of the N negative impedance circuits, and the sixth end of the first of the (N−1) first coupling circuits couples with the first end and the third end of a second of the N negative impedance circuits, wherein successive ones of the coupling circuit of the (N−1) first coupling circuits are singly coupled between successive neighboring pairs of the N negative impedance circuits.

2. The active bandpass filter of claim 1, wherein the N transmission line circuits include complementary conducting strip transmission line structures.

3. The active bandpass filter of claim 1, wherein the N transmission line circuits include microstrip line structures.

4. The active bandpass filter of claim 1, wherein the N transmission line circuits include strip line structures.

5. The active bandpass filter of claim 1, wherein the N transmission line circuits include coplanar waveguide transmission line structures.

6. The active bandpass filter of claim 1, wherein the N transmission line circuits include coupled transmission line structures.

7. The active bandpass filter of claim 1, wherein an equivalent electrical length of each one of the N transmission line circuits is a (M/2) times ±15% of λ, wherein M is a natural number and λ is a bandpass frequency wavelength of the bandpass filter.

8. The active bandpass filter of claim 1, wherein the N transmission line circuits include respective two-dimensional circuit layout structures.

9. The active bandpass filter of claim 1, wherein the N transmission line circuits include respective three-dimensional circuit layout structures.

10. The active bandpass filter of claim 1, wherein the N negative impedance circuits respectively at least include a cross-coupled pair circuit for providing negative impedance.

11. The active bandpass filter of claim 1, wherein the N negative impedance circuits respectively include a plurality of cross-coupled pair circuits for providing negative impedances.

12. The active bandpass filter of claim 1, wherein the DC circuit further includes:
   a current source having a first input end and a first output end, the first input end connecting with an adjustable DC voltage source; and a current repeater having a second input end and N second output ends, wherein the second input end connects with the first output end of the current source, and the N second output ends correspondingly connects with the N coupling elements so as to correspondingly couple to the N resonators with negative impedances, thereby providing the DC bias for the N negative impedance circuits.

13. The active bandpass filter of claim 1, wherein the DC circuit further includes:
a current repeater having a first input end and N first output ends, wherein the first input end connects with an adjustable DC voltage source, and the N first output ends correspondingly connect with the N coupling elements so as to correspondingly couple to the N resonators with negative impedances, thereby providing the DC bias for the N negative impedance circuits.

14. The active bandpass filter of claim 1, wherein the N coupling elements include an inductor, respectively.

15. The active bandpass filter of claim 1, wherein the N coupling elements include a conductive line, respectively.

16. The active bandpass filter of claim 1, wherein the at least (N−1) first coupling circuits at least include capacitive element, respectively.

17. The active bandpass filter of claim 1, wherein the at least (N−1) first coupling circuits at least include an inductive element, respectively.

18. The active bandpass filter of claim 1, wherein the at least (N−1) first coupling circuits at least include a coupled transmission line circuit comprising capacitive element and an inductive element, respectively.

19. The active bandpass filter of claim 1, further comprising an input coupling circuit including a fifth end and a sixth end and having the same structure as that of any one of the (N−1) first coupling circuits, wherein the fifth end of the input coupling circuit couples with a signal input end and the sixth end thereof couples with a first stage circuit of the N resonators with negative impedances.

20. The active bandpass filter of claim 1, further comprising an output coupling circuit including a fifth end and a sixth end and having the same structure as that of any one of the (N−1) first coupling circuits, wherein the fifth end of the output coupling circuit couples with an Nth stage circuit of the N resonators with negative impedances and the sixth end thereof couples with a signal output end.

21. The active bandpass filter of claim 1, further comprising a second coupling circuit including a fifth end and a sixth end and having the same structure as that of any one of the (N−1) first coupling circuits, wherein the fifth end of the second coupling circuit couples with a first stage circuit of the N resonators with negative impedances and the sixth end thereof couples with an Nth stage circuit of the N resonators with negative impedances.

* * * * *